US009257308B2

(12) United States Patent  (10) Patent No.: US 9,257,308 B2
De Sousa et al.  (45) Date of Patent: Feb. 9, 2016

(54) THERMAL INTERFACE MATERIAL ON PACKAGE

(71) Applicant: INTERNATIONAL BUSINESS MACHINES CORPORATION, Armonk, NY (US)

(72) Inventors: Isabel De Sousa, Chambly (CA); Annique Lavoie, Granby (CA); Eric Salvas, Otterburn Park (CA); Michel Turgeon, Granby (CA)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/836,461

(22) Filed: Aug. 26, 2015

(65) Prior Publication Data

US 2015/0364343 A1  Dec. 17, 2015

Related U.S. Application Data

(62) Division of application No. 14/162,411, filed on Jan. 23, 2014.

(51) Int. Cl.
| | | |
|---|---|---|
| *H01L 21/00* | (2006.01) | |
| *H01L 21/48* | (2006.01) | |
| *H01L 25/00* | (2006.01) | |

(52) U.S. Cl.
CPC .......... *H01L 21/4882* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 5,204,399 A | 4/1993 | Edelman et al. | |
| 5,300,459 A * | 4/1994 | Ushikubo | H01L 23/291 257/E23.032 |
| 5,773,561 A | 6/1998 | Sachdev et al. | |
| 5,847,929 A * | 12/1998 | Bernier | H01L 21/563 174/548 |
| 6,140,402 A | 10/2000 | Dietz et al. | |
| 6,982,192 B1 | 1/2006 | Vodrahalli et al. | |
| 7,297,399 B2 | 11/2007 | Zhang et al. | |
| 7,608,487 B2 | 10/2009 | Xiao et al. | |
| 2013/0221393 A1* | 8/2013 | Mao | H01L 33/44 257/98 |

OTHER PUBLICATIONS

Mukadam, M. et al., "Effects of Assembly Process Variables on Voiding at a Thermal Interface", The Ninth Intersociety Conference on Thermal and Thermomechanical Phenomena in Electronic Systems (ITHERM '04), vol. 1, 2004, 5 pages.

Gutmann, R.J. et al., "Three Dimensional (3D) ICs: A Technology Platform for Integrated Systems and Opportunities for New Polymeric Adhesives", First International IEEE Conference on Polymers and Adhesives in Microelectronics and Photonics, 2001, pp. 173-180.

(Continued)

*Primary Examiner* — Jack Chen
(74) *Attorney, Agent, or Firm* — Steven Meyers; Roberts Mlotkowski Safran & Cole, P.C.

(57) ABSTRACT

A packaged assembly is disclosed, including thermal interface material dispensed on an organic package and methods of manufacturing. The method includes dispensing a thermal interface material (TIM) on an electronic assembly. The method further includes removing volatile species of the TIM, prior to lid placement on the electronic assembly. The method further includes placing the lid on the TIM, over the electronic assembly. The method further includes pressing the lid onto the electronic assembly.

3 Claims, 5 Drawing Sheets

(56) References Cited

OTHER PUBLICATIONS

Notice of Allowance dated Oct. 5, 2015 for related U.S. Appl. No. 14/836,454, 11 pages.

Notice of Allowance dated Oct. 7, 2015 for related U.S. Appl. No. 14/836,447, 10 pages.

Notice of Allowance dated Oct. 7, 2015 for related U.S. Appl. No. 14/162,411, 11 pages.

* cited by examiner

THERMAL INTERFACE MATERIAL ON PACKAGE

FIELD OF THE INVENTION

The invention relates to semiconductor structures and, more particularly, to thermal interface materials dispensed on an organic package and methods of manufacturing.

BACKGROUND

Thermal management of multi-chip electronic packages is critical to ideal performance of both single and multi-chip electronic packages. Currently, management of thermal performance in multi-chip electronic packages is provided by encapsulating chips between a lid (e.g., heat spreader) and chip carrier using a thermal interface material (TIM) on the chips. For example, a TIM is dispensed on the chip and a lid is then pressed on the TIM to dissipate the heat generated by the chip, in the packaged assembly.

Adhesion of TIM between the lid and chip interface needs to be optimized in order to ensure adequate thermal performance. This is especially important due to increases in the chip size (e.g., higher than 20 mm) placed on an organic laminate. That is, due to the larger package, the stability and the adhesion of TIM undergo increased stresses due to thermal mismatch between the organic laminate and the chip. These stresses can result in delamination of TIM due to the bending of the package. Also, voiding phenomenon of the TIM decreases thermal performance of the package, which is also directly related to lack of coverage and reduced adhesion.

SUMMARY

In an aspect of the invention, a method comprises dispensing a thermal interface material (TIM) on an electronic assembly. The method further comprises removing volatile species of the TIM, prior to lid placement on the electronic assembly. The method further comprises placing the lid on the TIM, over the electronic assembly. The method further comprises pressing the lid onto the electronic assembly.

In an aspect of the invention, a method comprises removing organic compounds from a laminate and chip. The method further comprises dispensing a thermal interface material (TIM) on the chip. The method further comprises applying an adhesive around a periphery of the laminate. The method further comprises removing volatile species from the TIM. The method further comprises placing a lid on the laminate, in contact with the adhesive and the TIM. The method further comprises pressing the lid onto the adhesive and the TIM, at a predetermined pressing force to form a packaged assembly. The method further comprises curing the packaged assembly.

In an aspect of the invention, a method comprises: characterizing a thermal interface material (TIM); quantifying a characterization of voiding of the TIM; determining process parameters to optimize adhesion and minimize voiding level of the TIM; validating a thermal performance of the TIM using the steps of characterizing, quantifying and determining; and, if the validating does not meet thermal requirements of the TIM, then reverting to the determining step to adjust the process parameters.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to thermal interface materials (TIM) dispensed on an organic package and methods of manufacturing. In more specific embodiments, the present invention relates to methods of increasing the adhesion (e.g., elimination of a voiding phenomenon) and coverage of a TIM to improve thermal performance of a packaged assembly. Advantageously, by implementing the processes of the present invention, it is possible to improve the coverage and adhesion of the TIM to the chip surface and mitigate the impact of very large chip surfaces.

The improved adhesion of the TIM can be provided by different mechanisms including, for example, removing (e.g., evaporating) volatile species of the TIM which, in turn, alters the viscosity and activates certain chemical compounds in the TIM to improve the adhesion properties. For example, the volatile species can be removed by evaporation through an extended delay process, low temperature heating process or vacuum outgassing process. The methods of the present invention further comprise finding an operating range where a reduced viscosity, a lower volatile content and a maximum adhesion range is maintained during a heat spreader (lid) attach operation of TIM materials.

Experimentally, different solutions have been attempted to reduce the voiding phenomenon with TIM, to no avail. These methods include, for example, (i) different profile cure; (ii) faster ramp up methods; (iii) slower ramp up methods; (iv) different dispense methods, e.g., air pressure vs. auger pump; (v) different dispense patterns, e.g., dot, X, multi-line etc.; (vi) applying different loads at the lid pressure stage; (vii) heating the module before applying the final lid pressure; and (vii) two stage lid pressure apply (pre-press). These different processes, though, did not eliminate the voiding phenomenon on TIM material. The present invention has provided a solution to the voiding problem by improving the adhesion properties of the TIM, e.g., improve adhesion (2X), and increase thermal performance, using the methods described herein.

Figure 1:
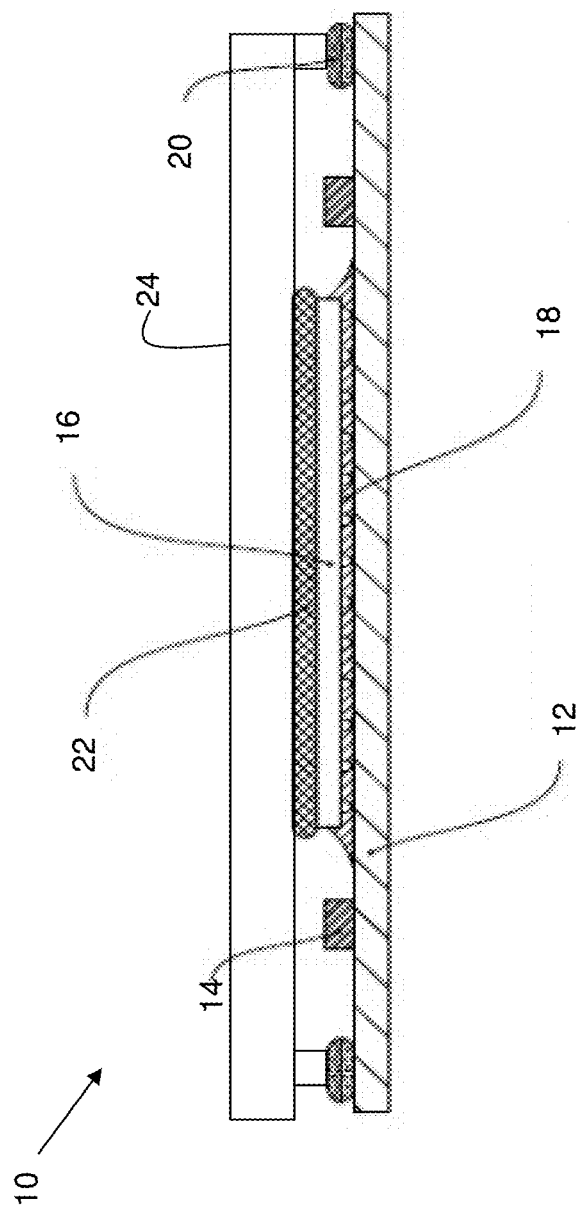
FIG. 1 shows a structure and respective processing steps in accordance with aspects of the present invention.

FIG. 1 shows a structure and respective processing steps in accordance with aspects of the present invention. More specifically, the assembly 10 includes a laminate 12 having, for example, one or more capacitors 14 and a chip (e.g., processor or other electronics assemblies) 16 disposed thereon. It should be understood, though, that other components, whether they be active or passive components, can also be provided on the laminate 12. The laminate 12 can be an organic laminate. A conventional underfill material (encapsulant material) 18 bonds the chip 16 to the laminate 12. One of skill in the art should understand that the underfill material 18 can protect sensitive electronic assemblies against damage and provide a strong mechanical bond between the chip 16 and the laminate, e.g., (circuit board) 12. An adhesive 20 is placed around a periphery of the laminate 12 and a TIM 22 is provided on the chip 16. In embodiments, the TIM 22 undergoes the processes of the present invention in order to improve adhesion to the chip 16. A lid 24 is attached to the laminate 12 by use of the adhesive 20 and the TIM 16. In embodiments, the lid 24 protects the components on the laminate 12, as should be understood by those of skill in the art.

Figure 2:
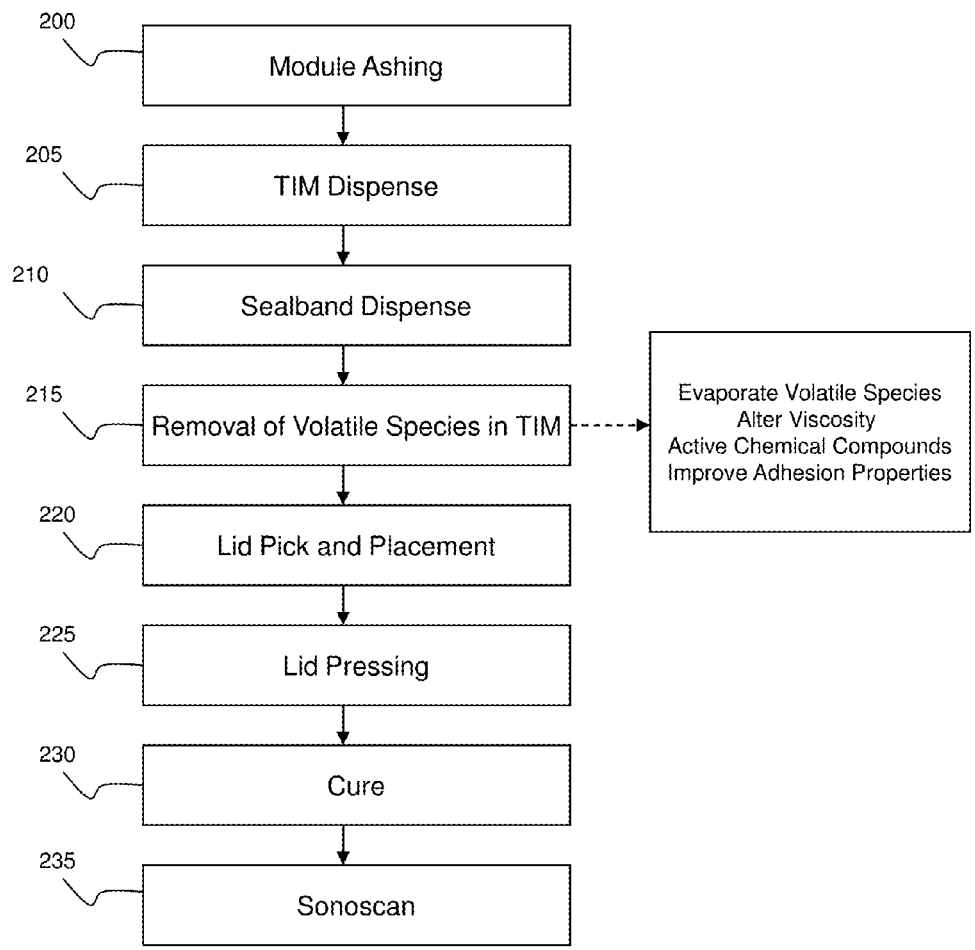
FIG. 2 shows a process flow for manufacturing the assembly of FIG. 1, in accordance with aspects of the present invention.

FIG. 2 shows a process flow for manufacturing the assembly of FIG. 1. For example, at step 200, the module undergoes an ashing process to remove any organic compounds from the laminate and chip. In embodiments, the ashing process can be a conventional plasma operation. At step 205, the TIM is dispensed on the chip, using known methods. For example, the TIM can be dispensed using an auger, air pressure, or other conventional method. In embodiments, the TIM can be dispensed in different patterns, depending on the application and engineering designs, for example. At step 210, a sealband (adhesive) is placed on the laminate. The sealband can be placed around a periphery of the laminate to maintain an adequate bond between the laminate and a subsequently placed lid.

At step 215, volatile species (e.g., cyclic siloxanes and decyl trimethoxysilane) are removed from the TIM in accordance with aspects of the present invention. The removal of the volatile species (cyclic siloxanes and decyl trimethoxysilane) increases the adhesion properties and thermal performance of the TIM by eliminating the voiding phenomenon. In embodiments, the removal of these volatile species can be achieved by, for example, (i) an extended delay process, (ii) low temperature heating or (iii) vacuum outgassing process.

Figure 4:
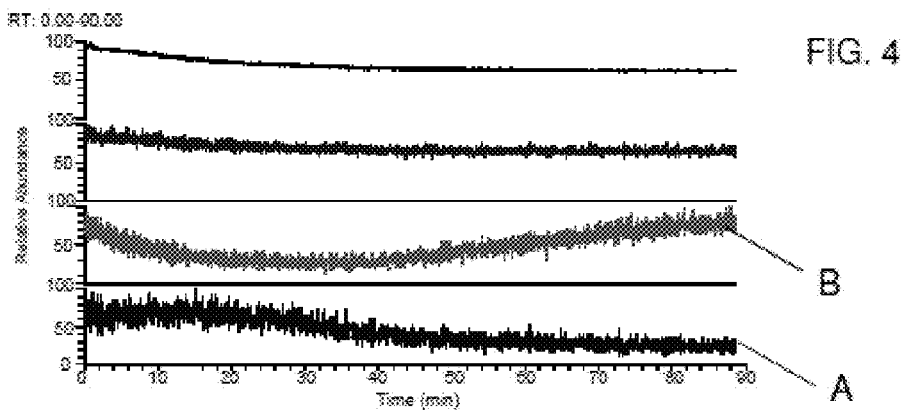
FIG. 4 shows an outgassing analysis at room temperature in accordance with the present invention.

By way of further explanation, in the extended delay process, the TIM remains at room temperature, e.g., about 21° C., for about 60 minutes, prior to lid placement. As shown in the graph of FIG. 4, for example, this process removes the volatile species and, in turn, improves adhesion properties, eliminating the void phenomenon. It should be understood that other temperature ranges are contemplated by the present invention for different times, in order to remove the volatile species. For example, the room temperature can vary between 18° C. to 26° C., and owing to variations in humidity, room temperature can be about 20° C. to 26° C., more preferably, 23° C. to 26° C. and even more preferably 20° C. to 23° C. In embodiments, a higher temperature and shorter time period is contemplated by the present invention or, alternatively, a lower temperature and a longer time period is also contemplated by the present invention. The overriding issue in any of these different variations is the removal of the volatile species prior to lid placement.

Alternatively, the TIM can undergo a heat treatment to maximize evaporation and surface reaction. In embodiments, the heat treatment of the present invention comprises subjecting the TIM to a temperature of about 45° C. to 55° C. for about 15-30 minutes in an oven, prior to lid placement. In more preferred embodiments, the heat treatment is conducted at about 50° C. for about 20 minutes or less, prior to lid placement. In even more preferred embodiments, the heat treatment is conducted at about 50° C. for about 15 minutes, prior to lid placement. The heat treatment of the present invention removes the volatile species and, in turn, eliminates the void phenomenon, improving adhesion and thermal performance properties of the TIM. This heating process was found to be more efficient with a maximal chemical surface area exposed in force air convection. That is, this heating process was faster than the extended delay process, e.g., improved throughput capacity. Moreover, the thermal performance of the package also increased using the processes of the present invention, compared to conventional processes.

As a further alternative, outgassing of the volatile species is also contemplated by the present invention, using a vacuum chamber. In embodiments, the outgassing processes can be provided at, e.g., about 23 in mg for about 10 minutes.

As should be understood by those of skill in the art, the methods of the present invention eliminated TIM voiding and delamination of TIM on large die products. The methods of the present invention also work on both single and multi chip modules. Moreover, in any of these embodiments there was no yield impact within the complete range of material properties. Additionally, and advantageously, stress data, e.g., thermal aging and thermal and humidity exposure, shows improvement of thermal performance at the corners of the interface between the chip and the lid. For example, the heating processes of the present invention increased the thermal performance of the TIM at the corners of the interface between the chip and the lid up to 10%, compared to conventionally processed packages.

Referring still to FIG. 2, at step 220, the lid is picked up and placed on the laminate. At step 225, the lid undergoes a pressing process to ensure proper bond line thickness to the adhesive and the TIM. At step 230, the packaged assembly undergoes a conventional curing process as recommended by the TIM/adhesive supplier, e.g., ramp up, dwell and cool down.

Figure 3:
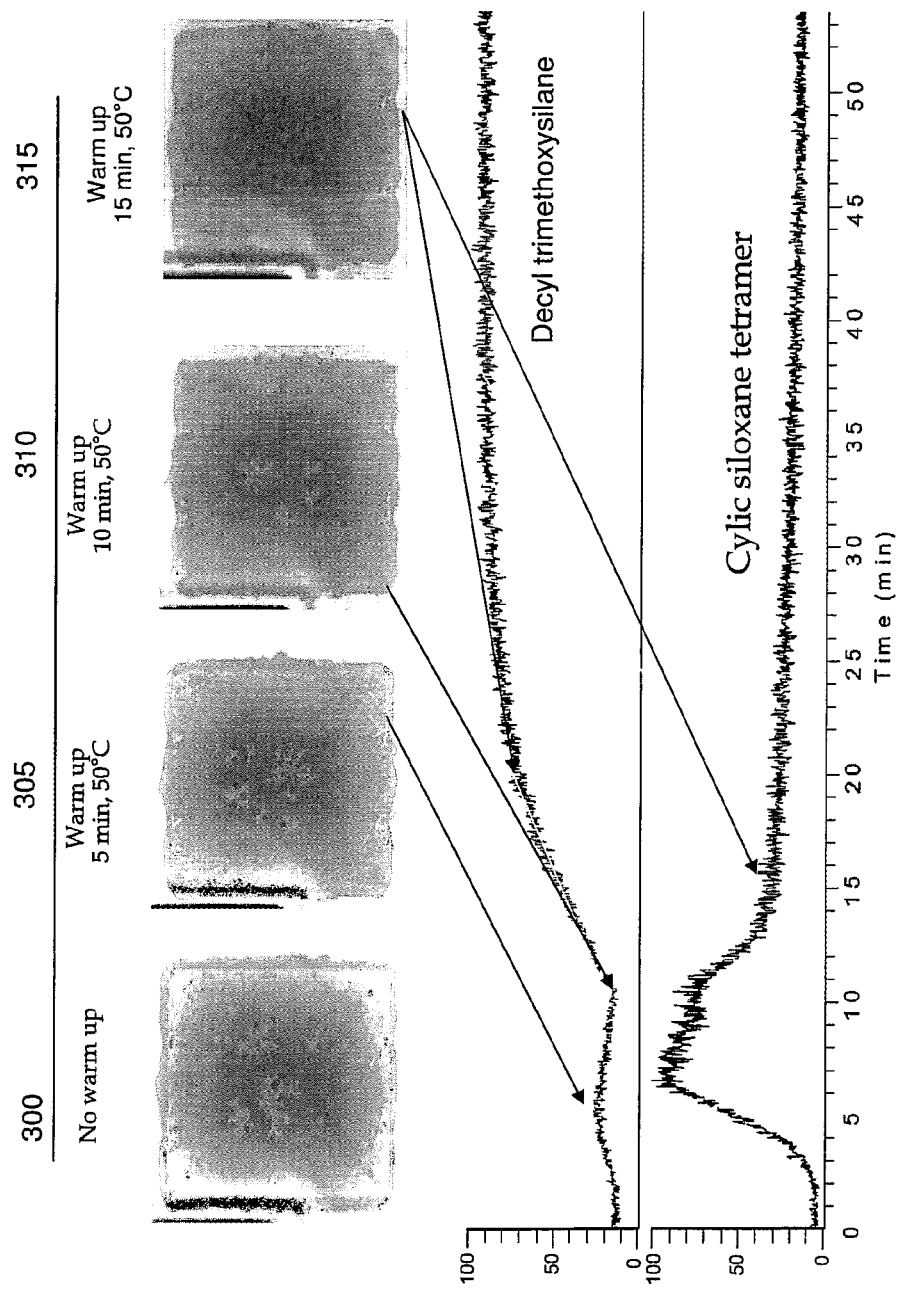
FIG. 3 shows a correlation of TIM voiding and outgassing (removal) of volatile species, in accordance with aspects of the present invention.

FIG. 3 shows a correlation of TIM voiding and outgassing (removal) of volatile species at 50° C., e.g., using the preheating process of the present invention. More specifically, FIG. 3 shows the gradual reduction in voiding, with improvement in adhesion occurring after about 10 minutes. In fact, FIG. 3 shows that peripheral delamination disappears completely in the process of the present invention. As further described, significant increase in outgassing of decyl trimethoxysilane occurred at 10 minutes into the 50° C. isothermal hold followed by a steady-state evolution throughout the remainder of the 50° C. hold. An initial bump in outgassing of the cyclic siloxanes was followed by progressive drop with continued hold at 50° C.

More specifically, the top portion of FIG. 3 shows several sonograms 300, 305, 310 and 315 of the TIM, representing the voiding phenomenon. These different sonograms 300, 305, 310 and 315 are correlated over time and temperature to the removal of cyclic siloxanes and decyl trimethoxysilane. By way of example, sonogram 300 represents a voiding phenomenon of the TIM prior to heating. Sonogram 305 shows a slight reduction of the voiding phenomenon after 5 minutes at 50° C. This slight reduction is correlated with an outgassing (removal) of decyl trimethoxysilane. Sonogram 310 shows a further reduction of the voiding phenomenon after 10 minutes at 50° C. This further reduction is correlated with a further outgassing (removal) of decyl trimethoxysilane. Sonogram 315 shows the complete elimination of the voiding phenomenon after 15 minutes at 50° C. This elimination is correlated with an outgassing of cyclic siloxanes tetramer. Accordingly, FIG. 3 demonstrates that the removal of decyl trimethoxysilane and cyclic siloxanes tetramer will eliminate the voiding phenomenon after 15 minutes at 50° C.

FIG. 4 shows an outgassing analysis at room temperature in accordance with the present invention. As shown in FIG. 4, after 60 minutes at room temperature there is no outgassing of cyclic siloxanes and decyl trimethoxysilane (as shown by Lines "A" and "B" respectively). Through actual test data, the voiding phenomenon of the TIM was found to be eliminated at about 60 minutes at room temperature.

Figure 5:
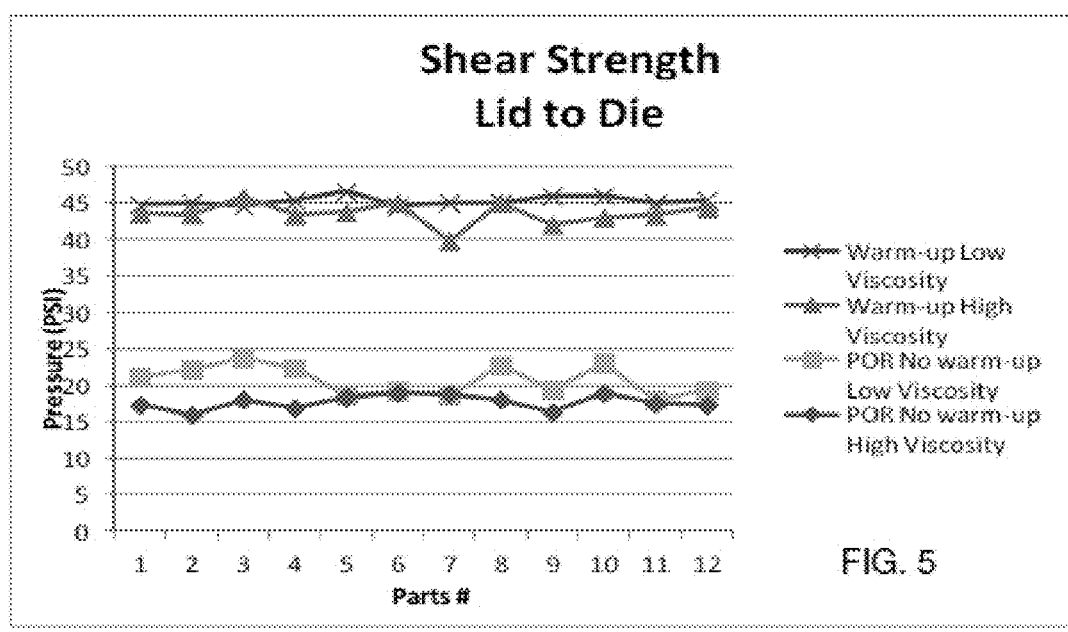
FIG. 5 shows a graph comparing shear strength of a lid to die, in accordance with aspects of the present invention.

FIG. 5 shows a graph comparing shear strength of a lid to die for a low viscosity TIM and a higher viscosity TIM, in accordance with aspects of the present invention. More specifically, the graph of FIG. 5 demonstrates improved shear strength of the TIM for both incoming low viscosity and high viscosity TIM products, compared to conventional current process of record (POR). As shown in FIG. 5, for example, TIM for both incoming low viscosity and high viscosity TIM products that were heated to 50° C. for less than 20 minutes show shear strength improvement over untreated incoming low viscosity and high viscosity TIM products. In embodiments, this improvement was more than 2× improvement. Accordingly, improvement in adhesion was seen using the methods of the present invention regardless of the incoming viscosity of the TIM products.

Figure 6:
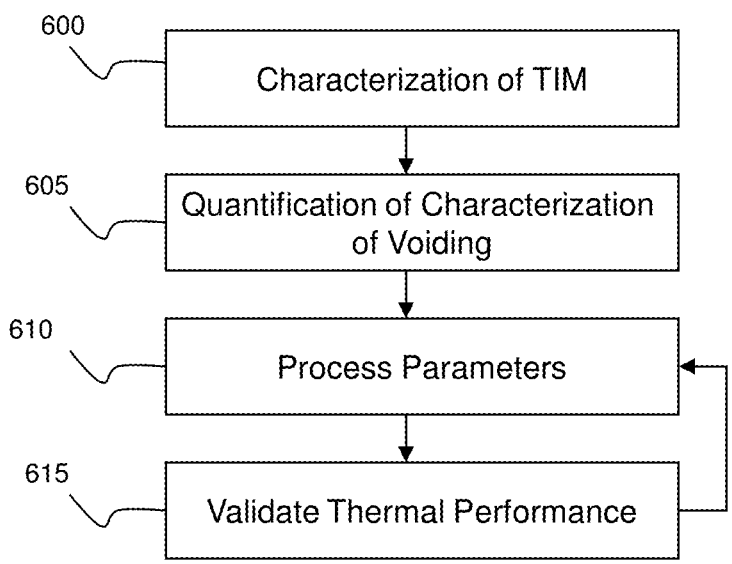
FIG. 6 shows a methodology to improve TIM performance, over a range of TIM products in accordance with aspects of the present invention.

FIG. 6 shows a methodology to improve TIM performance, over a range of TIM products in accordance with aspects of the present invention. Specifically, at step 600, the characterization of the TIM is provided or determined. This characterization includes, for example, volatile content, temperature range for polymerization and cure, rheological behavior and viscosity range. At step 605, quantification and characterization of voiding level and adhesion is provided (determined), for the material characterized at step 600. As step 610, process parameters to optimize adhesion and minimize voiding level are initially defined. These process parameters can include, for example, dispense method such as the dispensing equipment and pattern, dispense delay, pressure load apply during adhesive cure, and time and temperature range for preconditioning chemical prior to cure step. At step 615, the thermal performance can be validated. If the thermal performance is not within defined ranges, e.g., within required thermal performance, the process reverts to step 610 where the process parameters can be adjusted to optimize adhesion and minimize voiding level.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    removing organic compounds from a laminate and chip;
    dispensing a thermal interface material (TIM) on the chip;
    applying an adhesive around a periphery of the laminate;
    removing volatile species from the TIM;
    placing a lid on the laminate, in contact with the adhesive and the TIM;
    pressing the lid onto the adhesive and the TIM, at a predetermined pressing force to form a packaged assembly; and
    curing the packaged assembly,
    wherein the removal of the volatile species comprises subjecting the TIM to a vacuum outgassing process.

2. The method of claim 1, wherein the removing of the volatile species is provided prior to lid placement.

3. The method of claim 2, wherein the removing of the volatile species comprises removing cyclic siloxanes and decyl trimethoxysilane.

\* \* \* \* \*